United States Patent [19]
Hashizume

[11] Patent Number: 5,646,422
[45] Date of Patent: Jul. 8, 1997

[54] SEMICONDUCTOR INTEGRATED CIRCUIT DEVICE

[75] Inventor: Takeshi Hashizume, Hyogo-ken, Japan

[73] Assignee: Mitsubishi Denki Kabushiki Kaisha, Tokyo, Japan

[21] Appl. No.: 518,622

[22] Filed: Aug. 23, 1995

Related U.S. Application Data

[63] Continuation of Ser. No. 286,112, Aug. 4, 1994, abandoned, which is a continuation of Ser. No. 66,312, May 24, 1993, abandoned, which is a continuation of Ser. No. 730,133, Jul. 15, 1991, abandoned.

[30] Foreign Application Priority Data

Aug. 31, 1990 [JP] Japan .................................. 2-231643

[51] Int. Cl.$^6$ ........................................ H01L 27/10
[52] U.S. Cl. ........................ 257/48; 257/203; 257/207; 257/210
[58] Field of Search .................. 357/42, 45; 371/22.3; 257/203, 207, 210, 48

[56] References Cited

U.S. PATENT DOCUMENTS

| | | | |
|---|---|---|---|
| 4,782,283 | 11/1988 | Zasio | 371/22.3 |
| 4,872,169 | 10/1989 | Whetsul, Jr. | 371/22.3 |

FOREIGN PATENT DOCUMENTS

| | | |
|---|---|---|
| 0181011 | 5/1985 | European Pat. Off. . |
| 3817143 | 12/1988 | Germany . |
| 3742655 | 7/1989 | Germany . |
| 63-152145 | 12/1986 | Japan . |
| 63-285945 | 5/1987 | Japan . |
| 1-128462 | 11/1987 | Japan . |

OTHER PUBLICATIONS

"Standard Test Access Port and Boundary–Scan Architecture", IEEE Standard 1149.1/D6, Nov. 1989, pp. 1–1 to 5–17.

*Primary Examiner*—Ngân V. Ngô
*Attorney, Agent, or Firm*—Lowe, Price, LeBlanc & Becker

[57] ABSTRACT

A semiconductor integrated circuit device includes an internal function circuit formed on a first rectangular region on a rectangular semiconductor chip for implementing a function specific to the device, and a predetermined function control circuit formed on a second rectangular region for implementing a fixed function irrespective of the function implemented by said internal function circuit. First and second rectangular regions are separate regions. In the hierarchical design of an integrated circuit device, the circuit of the first rectangular region can be used as the structure component of another integrated circuit on another chip. The predetermined function control circuit can be laid out on the second rectangular region of another chip. The predetermined function control circuit is a testing circuit of boundary scan method, including a standardized structure component.

4 Claims, 12 Drawing Sheets

SEMICONDUCTOR INTEGRATED CIRCUIT DEVICE

This application is a continuation of application Ser. No. 08/286,112 filed Aug. 4, 1994, now abandoned, which is a continuation of application Ser. No. 08/066,312 filed May 24, 1993, now abandoned, which is a continuation of application Ser. No. 07/730,133 filed Jul. 15, 1991, now abandoned.

BACKGROUND OF THE INVENTION

1. Field of the Invention

The present invention relates to semiconductor integrated circuit devices, and more particularly, to a semiconductor integrated circuit device including an internal function circuit and a predetermined function control circuit for implementing a predeterminedly fixed function irrelevant to the function implemented by the internal function circuit. The invention has particular applicability to a semiconductor integrated circuit device that is test-designed according to standardized architecture for facilitating internal estimation of integrated circuit devices.

2. Description of the Background Art

In accordance with the progress of recent surface mount technology (SMT) and multilayering technology of printed-circuit boards, semiconductor integrated circuit devices are mounted on a single printed-circuit board in high density. Surface mount technology includes the techniques of connecting planarly the leads or connection terminals of the circuit devices to the connection pattern on the printed-circuit board by soldering. The surface mount technology has features such as (1) lead pitch is less than a half of that of a normal DIP (dual-in-line package) to allow high density mounting by the usage of surface mount type packages, and (2) high density connection can be implemented since the provision of through holes in the printed-circuit board is not necessary.

It is necessary to carry out testing at a printed-circuit board (referred to simply as board hereinafter) level and estimate each integrated circuit device after the mounting of semiconductor integrated circuit devices on the printed-circuit board.

However, it has become difficult to carry out testing at the board level such as in-circuit testing due to high density connection, and leadless or minimum lead structure in such surface mounted boards.

The in-circuit test is a method of estimating a board by pressure-attaching to the backside surface of a board, spring type probes disposed at a predetermined spacing of several mm, and testing individually all the chips on the board, after all the semiconductor integrated circuit devices (chips) are mounted thereon. The board is determined to be reliable when all the semiconductor integrated circuit devices have no faults.

However, it has become difficult to set a multistylus probe at the terminals of the semiconductor integrated circuit devices, due to the progress of recent surface mount technology. The production of a dedicated testing apparatus or jigs (fixtures) for a particular in-circuit testing will increase the cost.

In order to solve the problem of difficulty in testing at the board level, a test facilitation method has been proposed in which the scan design used conventionally for semiconductor chip internal test facilitation is expanded to board level.

The scan design is one of the design methods for facilitating testing of sequential circuits. The scan design will be explained hereinafter briefly with reference to FIG. 1.

FIG. 1 is a diagram showing a principle structure of serial scan, which is one kind of scan designs. Referring to FIG. 1, an integrated circuit device (referred to as a chip hereinafter) comprises combination circuits C1 and C2 for carrying out predetermined functions, and flipflops FF1–FF6 functioning as storage elements. Flipflops FF1 and FF2 receive a signal from input terminals IT4 and IT1, respectively, to supply a signal to combination circuit C1. Combination circuit C1 directly receives a signal via input terminals IT2 and IT3. Flipflops FF3 and FF4 receive a signal from combination circuit C1 to transmit the same to combination circuit C2. A signal from combination circuit C1 is directly transmitted to combination circuit C2.

Flipflops FF5 and FF6 receive a signal from combination circuit C2 to generate a signal to output terminals OT4 and OT1. A signal as an output is provided from combination circuit C2 also to output terminals OT2 and OT3.

Flipflops FF1–FF6 are connected in series through a scan path SP to form a serial shift register between a scan in terminal SI and a scan out terminal SO. Each of flipflops FF1–FF6 is provided with a test facilitating circuit for switching the signal destination according to an operation mode. Thus, by connecting in series flipflops serving as storage elements in a sequential circuit to implement a shift register configuration, it is possible to substitute a sequential circuit by a combination circuit to facilitate the generation of test patterns of a sequential circuit much complicated in comparison with the test patterns of a combination circuit.

In test mode, test data from scan in terminal SI is loaded to flipflops FF1–FF6, whereby the test data is supplied to combination circuits C1 and C2. After data from input terminals IT2 and IT3 are supplied to combination circuits C1 and C2, the resultant data after the operation of combination circuits C1 and C2 are read out to flipflops FF1–FF6. Then, the contents of flipflops FF1–FF6 are sequentially read out from scan out terminal SO. By comparing the data read out from scan out terminal SO with an expected value determined in advance for each test pattern, determination can be made whether the chip is reliable or not.

FIG. 2 illustrates an example of a specific structure of this scan design, showing a structure of a chip referred to as the scan path method. Referring to FIG. 2, flipflops F1–Fn are implemented as a serial shift register. Flipflops F1–Fn are the flipflops included in the sequential circuit. The sequential circuit is constituted by flipflops F1–Fn and a combination circuit C.

Flipflops F1–Fn are usually formed of flipflops of master slave structure, operating in response to a clock signal CLK and a test clock signal TCLK. Each of flipflops F1–Fn responds to clock signal CLK to set therein the data supplied to input terminal D1, and responds to clock signal TCLK to set therein the data supplied to input terminal D2. In the structure of FIG. 2, flipflops F1–Fn constitute a serial shift register with scan in terminal SI as the input and scan out terminal SO as the output. Circuit testing is carried out in the following procedures in the structure of FIG. 2.

In response to clock signal TCLK, a test pattern is applied from scan in terminal SI to each of flipflops F1–Fn. Then, the test pattern is applied to circuit input IT of combination circuit C. The response in circuit output OT of combination circuit C is observed. Clock signal CLK is applied, whereby the data from combination circuit C is set to each of flipflops F1–Fn. Then, clock signal TCLK is generated, whereby the contents of each of flipflops F1–Fn are sequentially read out and observed. The testing of the circuit is carried out by repeating the above procedures.

If the above-described scan design is extended to the board level, testing at board level is possible without touching probes. In other words, a boundary scan connecting a shift register (SRL) to the input/output port of each chip and connecting serially these shift registers to form a scan path is effective for testing at board level.

It is not desirable to implement test design of board level according to such scan design by disposing a test directed chip incorporating a testing circuit on the board, because this will increase the number of devices on the board. It is therefore preferable to make a design forming testing circuit such as a scanning register within each chip.

The specification of test design requires to be unified for each chip formed on the board since each chip is interconnected to form a test data transmitting path in boundary scan design.

Standardization of board level test facilitation design is studied to meet such requirements. An example of such boundary scan standard is shown, for example, in "Standard Test Access Port and Boundary-Scan Architecture" in IEEE Standard (P1149.1) D6.

FIG. 3 schematically shows a configuration on a board employing the boundary scan method. FIG. 3 shows an example where four chips CH1, CH2, CH3 and CH4 are mounted on a board B. Chips CH1–CH4 include internal function circuits IL1–IL4, respectively, for implementing functions specific to each circuit. Each of internal function circuits IL1–IL4 send and receives a signal to and from a pin terminal (pad) PT via each input/output cell (input/output buffer) IOS. Identical reference numbers are given to each input/output cell and pin terminal of chips CH1–CH4. An input/output cell comprises an input/output buffer and a testing circuit.

Chips CH1–CH4 are interconnected via a signal line NS for sending and receiving data in normal operation. Chips CH1–CH4 are connected in series through a scan path SP. This scan path provides a test data transmission path. This scan path is formed by connecting serially the testing circuits provided in the input/output cells internal to the chip. The input port of scan path SP is connected to scan in terminal SI via an edge connector EC formed in board B. The output port of scan path SP is connected to scan out terminal SO of edge connector EC.

With the above-described structure, it is possible to access a desired chip via scan path SP from edge connector EC to carry out estimation of the chips at board level without using an in-circuit tester.

The boundary scan standard defines three test modes. One is called internal testing, which tests the chip itself (i.e. internal function circuit carrying out normal operation).

FIG. 4 is a diagram for explaining internal test mode. Referring to FIG. 4, input/output cells IOS1–IOS8 of chip CH are connected in series between test data input pin TDI and test data output pin TDO via scan path SP to form a shift resistor. It is to be noted that the testing circuits connected to input/output cells IOS1–IOS8 are serially connected to implement the shift register.

Input/output cells IOS1–IOS4 implement an input circuit to receive and transmit to internal function circuit IL the data supplied from terminals PT1–PT4. Input/output cells IOS5–IOS8 implement an output circuit to receive the data from internal function circuit IL and provide the same to output terminals PT5–PT8. Test data input pin TDI and test data output pin TDO are pin terminals provided specially for testing. Internal test mode carries out testing similar to the scan design method of chip level.

More specifically, test data is supplied via test data input pin TDI to chip CH, whereby a test pattern data is set to each of input/output cells IOS1–IOS8. Internal function circuit IL is then operated, followed by the setting again of data from internal function circuit IL to input/output cells IOS1–IOS8 and by reading out of the data into input/output cells IOS1–IOS8 via output pin TDO.

FIG. 5 is a diagram for explaining an external test mode which is the second test mode. This external test mode verifies the interconnection between chips such as the connections on the board. Referring to FIG. 5, test data output terminal TDO of chip CHA is connected to test data input terminal TDI of chip CHB via scan path SP. The procedure of this external test is as follows.

First, test pattern is sent serially from an external tester to the boundary scan path in synchronism with a test clock signal (not shown). This sets the test pattern at the output cell IOS of the chip (chip CHA in FIG. 5). By applying a normal operation clock signal, the set test pattern is transferred in parallel from the normal operation output pins PT of the chip to be set to the input cell ISO of an adjacent chip (chips CHB and CHC in FIG. 5). Then, in response to a test clock signal, the data set in the input cell ISO of the connected chip (chips CHB and CHC in FIG. 5) are read out serially via the scan path. By comparing this serially read out data with an expected data, the interconnection between chips can be verified.

FIG. 6 is a diagram for explaining a sample test mode which is the third test mode. Referring to FIG. 6, a test clock signal is applied at a certain timing during the operation of internal function circuit IL carrying out normal operation, whereby the normal operation signal of internal function circuit IL is captured into input/output cell ISO. Fault diagnosis of the chips and the system can be carried out by reading out the data captured in input/output cell IOS via scan path SP. Although it may not be clear from FIGS. 3–6, a path for transmitting a test clock signal and a path for transmitting a system clock signal are provided in the boundary scan method, similar to those of the scan design at chip level. These two separate clock signals may be generated at different timings to send and derive test data to and from a chip without changing the system logic state. With the test clock signal, it is also possible to shift test data during the system operation of the chip.

It is necessary to form one long boundary scan chain by connecting serially the chips on the board in the above described boundary scan method. This requires an identical interface for the boundary scan registers of each chip. Therefore, the standard of the testing circuit provided in each chip is standardized.

FIG. 7 schematically shows a structure of a testing circuit described in the aforementioned IEEE standard (P1149.1).

Referring to FIG. 7, a testing circuit includes a data register group 6 for forming a scan path transmitting test data, and a bypass register 8. Data register group 6 comprises a boundary scan register 16 connected to input/output cell (input/output buffer) and data registers 4a–4f provided corresponding to each functional block (functional module) constituting an internal function circuit formed within the chip. Data registers 4a–4f and boundary scan register 16 of register group 6 and bypass register 8 have the input ports thereof connected in parallel to test data input terminal 12 which receives test data TDI, and the outputs thereof connected in parallel to a multiplexer 7a.

The testing circuit further includes a control circuit (TAP controller; test access port controller) 11, an instruction register 9, a command decoder 10, and a second multiplexer 7b.

Control circuit 11 is a state transition circuit responsive to a test mode selecting signal TMS and a test clock signal TCK supplied from test mode input terminal 13 and test clock input terminal 14, respectively, to produce a control signal 17 for each of registers 4a–4f, 8, 9 and 16. Control circuit 11 implements various test states according to the state of the test mode selecting signal TMS at the time of the rise of test clock signal TCK. This state transition is standardized in the aforementioned IEEE specification.

Instruction register 9 receives a command data supplied from test data input terminal 12 under the control of control circuit 11. The command data code loaded to instruction register 9 is supplied to command decoder 10 to be decoded, whereby a desired command is executed.

Multiplexer 7a responds to a control signal 18 from command decoder 10 to select one of the output of bypass register 8, data registers 4a–4f, and boundary scan register 16 to supply the selected output to one input of multiplexer 7b. The other input of second multiplexer 7b is supplied with the output of instruction register 9. The second multiplexer 7b responds to control signal 19 from control circuit 11 to select the output of either of multiplexer 7a and instruction register 9. The selected output is supplied to test data output terminal 15.

Control circuit 11 manages the test logics of the chip, while instruction register 9 determines which operation to be executed and which data register to be used at that time.

Test clock signal TCK is a clock signal independent of the system clock signal. This allows the input and output of test data to and from a chip without changing the state of the system logic. It is also possible to shift the test data via the scan path in response to the test clock signal TCK during the system operation of each chip.

Input test data TDI and output test data TDO are the input and output of the serial test data. Test data TDI on input terminal 12 is shifted into a selected register (instruction register 9 or register group 6) at the time of the rise of the test clock signal TCK. Test data TDO at output terminal 15 appears at the time of fall of the test clock signal TCK.

Test mode selecting signal TMS is a test control signal from a "bus master" (not shown). This bus master is a system (or a component) managing the testing procedures. Control circuit 11 specifies the test logic based on the procedure defined by the standard specification, according to the state of the test mode selecting signal TMS at the rising of the test clock signal TCK. Examples of test logic states are as follows:

"initialization of the scan sequence of test data registers included in register group 6", "initialization of scan sequence of instruction register", "load in parallel the response data from the internal function circuit to the data register selected by the command set in instruction register 9", "connect the selected data register between test data input terminal 12 and test data output terminal 15 to shift serially data in response to the test clock signal TCK", and "connect instruction register 9 between test data input terminal 12 and test data output terminal 15 to shift out the content in response to test clock signal TCK".

Bypass register 8 is used to reduce the transfer time when it is not necessary to set the test data in the input/output cells of the chip and only the transfer of test data to an adjacent chip is required.

Such a chip produced according to the above-described standardized test design requires the mounting of a testing circuit having a structure of FIG. 7. The testing circuit comprises a function independent of the structure of the internal function circuit formed within the chip, i.e. comprises a fixed function necessary in common to each chip, excluding registers 4a–4f and 16 included in register group 6 in FIG. 7. That is to say, boundary scan register 16 is formed to be connected to each input/output cell, and is generally constituted by a shift register latch provided corresponding to each pin terminal. Data registers 4a–4f are shift register latches connected to each functional block in scan-designing the functional blocks included in the internal function circuit. The structure and the arrangement of these registers all depend upon the structure of the internal function circuit of the chip, and differ for different chips.

In chip design, a functional circuit unit implementing a predetermined function independent of the structure and function of the internal function circuit and required in common for each chip, is treated as a macro function block 3 as shown in FIG. 8, for example. It is implemented as one circuit block similar to that constituting the other internal function circuits.

FIG. 8 is an example of a chip layout. Input/output cells (input/output buffer) 5 are formed at the periphery of a semiconductor chip 1. Boundary scan registers 16 are formed in the periphery of the internal region of chip 1 so as to be connected to I/O cells (I/O buffer) 5. Semiconductor chip 1 comprises functional units (circuit block) 2a, 2b, 2c, 2d and 2e constituting the internal function circuits of the chip internal region. A test circuit block 3 is formed on the semiconductor chip. Test circuit block 3 corresponds to circuit portion 3' excluding register group 6 in FIG. 7. The term "macro" means a functional block which is the design unit at the time of gate array design.

Data registers for testing 4a–4f are arranged corresponding to each of functional blocks 2a–2f constituting the internal function circuits.

Each I/O cell (I/O buffer) provided in the periphery of chip 1 comprises a pin terminal (or bonding pad) PT. Boundary scan register 16 is formed between I/O cell 5 and the chip internal region to be included in or to contact I/O cell 5.

In the internal region of semiconductor chip 1, test data input/output signal line and signal line 10 including a control signal line to data registers 4a–4f are wired between data registers 4a–4f and boundary scan register 16, and test circuit block 3. A signal line is wired between each functional modules 2a–2f and between functional blocks 2a–2f and I/O cell 5 for transmitting the signals on normal operation. In FIG. 8, only test data I/O signal line 10 is indicated to simplify the drawing.

Next, a case is considered of implementing a high functional chip by adding a new function to the function of the chip of FIG. 8, i.e. implementing the so-called hierarchical design.

In the case of hierarchical design, the original chip is often used without modifying the physical layout of the chip. This avoids re-designing the existing circuit to reduce the development cost. By using a circuit having the layout fixed, it is possible to ensure in advance the performance of that portion. In such chip circuit design, a functional block is stored in a library. Using the functional block in the reserved libraries, the so-called computer aided design (CAD) is employed that automatically carries out the layout of the circuits on a chip, where the functional block in the reserved libraries have their performance guaranteed in advance.

The implementation of a chip comprising an additional new function is considered using the chip of FIG. 8. FIG. 9 shows a structure of a chip obtained by such hierarchical design.

Referring to FIG. 9 illustrating a layout of a hierarchically designed chip, the chip comprises a compound circuit block 1a obtained by taking out the internal region of chip 1 in FIG. 8 (a region excluding boundary register 16 and I/O cell 5), and newly added function circuit blocks 2g, 2h, 2i, 2j and 2k. This newly formed chip 1b further comprises a testing circuit 3b to comply with the boundary scan standard.

Each of functional blocks 2g–2k are supplied with test data registers 4g–4k for transmitting test data. Each of test data registers 4g–4h has its operation controlled by testing circuit 3b.

Compound circuit block 1a comprises testing circuit block 3a in the internal region because the internal region of chip 1 of FIG. 8 is directly used. Test circuit block 3a and the new test circuit block 3b have common functions and identical structure components since they comprise a predetermined structure irrespective of the structure and function of the internal function circuit. Test circuit block 3a is used to carry out testing of functional blocks 2a–2f existing in the internal of compound circuit block 1a. Test circuit block 3b is used to carry out testing of the newly added functional blocks 2g–2k.

In the structure of FIG. 9, two test circuit blocks having common functions are required. This means that the necessary area for the test circuit block and the number of test pins are two times that of a single test circuit structure. This deteriorates the area usage efficiency of the chip, as well as requiring extra external pin terminals.

Although this circuit device is implemented as one chip, the testing of the circuit has a test structure of treating virtually two chips for compound function block 1a portion and another newly added circuit block (functional block), yielding a problem that the test execution sequence and the test pattern becomes complicated.

The testing circuit is necessary in common to each chip. Particularly, the instruction register, the bypass register and the control circuit (TAP controller) often require a common circuit irrelevant of the structure of the functional block in the chip. This testing circuit differs in scale of multiplexer according to the number of test data registers in the internal functional block. It is therefore necessary to re-design the testing circuit for each chip design. It is not efficient to include a test circuit block within the chip internal region.

A structure shown in FIG. 10 may also be considered in implementation of hierarchical design. In the structure of the chip of FIG. 10, only the test circuit block 3 exists within compound functional block 1a. With test circuit block 3, testing is carried out for functional blocks 2a–2f existing within compound functional block 1a, and for the newly added functional blocks 2g–2k, i.e. for all for the functional blocks existing within chip 1b.

In implementing this layout, it is necessary to control each of test data registers 4g–4k provided corresponding to the newly added functional blocks 2g–2h with test circuit block 3, in order to directly use the internal region of chip 1 of FIG. 8. It is therefore necessary to design test circuit block 3 taking into consideration portions to be newly added, such as an input corresponding to the newly added circuit block, i.e. an input portion for receiving test data TDI from a test data input terminal for transmitting the same to the newly added test data register, and a first multiplexer to allow the added data register to be inclusively selected for selecting the output of the newly added circuit block and providing the new test output data TDO. Because it is necessary to design in advance redundant test data input/output lines and control lines for test circuit block 3, the area usage efficiency is reduced, since a testing circuit occupying some unnecessarily additional area in chip 1 which provides the base of compound functional block 1a is employed for chip 1. It is practically almost impossible to design a testing circuit taking into consideration all possible chip designs.

In the structure of FIG. 10, test circuit block 3 is provided within compound function block 1a, with data input/output lines and control lines to test data registers 4g–4k corresponding to the newly added functional blocks provided therein. Such test data input/output lines and control signal lines cause local concentration, which leads to a problem of increase in the occupying area of the connection region. This will reduce the area usage efficiency of chip 1b.

In implementing hierarchical design using chip 1 of FIG. 8, the layout of chip 1b shown in FIG. 11 may be obtained. In the layout of chip 1b of FIG. 11, the test circuit block is removed from compound functional block 1a. The testing of functional blocks 2a–2f within compound functional block 1a is carried out by a newly designed test circuit block 3. In the layout of chip 1b, the testing of all functional blocks 2a–2k are carried out by test circuit block 3.

However, the layout of chip 1b of FIG. 11 cannot be implemented using directly the internal region of chip 1 of FIG. 8. In other words, it is necessary to remove test circuit block 3 existing in chip 1 of FIG. 8 and establish a new structure allowing direct input and output of test data input and output lines and control signal line 10a of functional blocks 2a–2f from an external source of compound functional block 1a, in changing the layout of chip 1 of FIG. 8 into that of compound function block 1a. It is difficult to remove only the test circuit block from the physical layout of the internal region of chip 1 for the usage as the basic module. The physical layout of chip 1 of FIG. 8 including a test circuit block in the internal region has its performance guaranteed. It may not be possible to ensure the guarantee of the performance if the test circuit block is simply removed from that physical layout. There is possibility that a chip having the desired performance cannot be obtained.

If the test circuit block is removed from the physical layout at the time of hierarchical design for the compound functional block derived from chip 1 to be used as the base module, the test circuit block area will provide an empty region therein. This will reduce the area usage efficiency of compound functional block 1a to produce a problem that an optimum layout cannot be obtained.

As described above, the layout of a conventional semiconductor circuit device has a circuit block with functions common to each chip placed in the chip internal region as well as the functional blocks used in normal system operation. Therefore, there is a problem that a chip having an optimum layout cannot be obtained in hierarchical design for designing a larger scaled and high functional chip, using the chip as one compound function unit.

SUMMARY OF THE INVENTION

An object of the present invention is to provide a semiconductor integrated circuit device comprising an improved layout without disadvantages of a conventional semiconductor integrated circuit device.

Another object of the present invention is to provide a semiconductor integrated circuit device comprising a layout that can easily remove a circuit block existing in common to a plurality of chips from the physical layout of each chip.

A further object of the present invention is to provide a semiconductor integrated circuit device comprising a layout that can easily implement hierarchical design.

A still further object of the present invention is to provide a semiconductor integrated circuit device comprising only an irreducible minimum of required circuit blocks.

In accordance with the present invention, a semiconductor integrated circuit device includes an internal function circuit formed on a first rectangular area on a rectangular semiconductor chip for implementing functions specific to the semiconductor integrated circuit device, and a predetermined function control circuit formed in a second rectangular region different from the first rectangular region for implementing a predeterminedly fixed function, irrespective of the functions implemented by the internal function circuit of the integrated circuit device.

The first rectangular region is used as the chip internal region. The predetermined function control circuit used common to each chip is formed in the second rectangular region different from the first rectangular region. The second rectangular region is independent of the first rectangular region, which can be removed easily from the physical layout without affecting the layout of the internal function block.

Each internal function circuits created as the internal region is laid out realizing an optimum area usage efficiency within the first rectangular region and has the performance thereof guaranteed to enable hierarchical design using the internal region.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Figure 1:
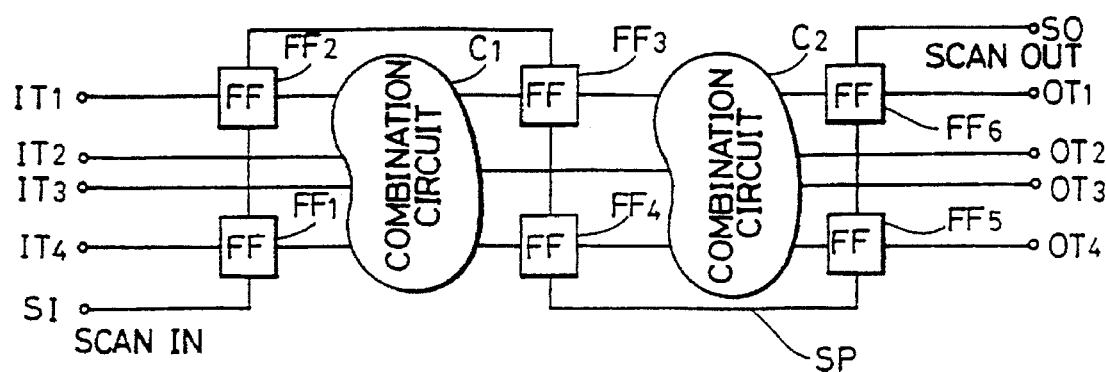
FIG. 1 shows the principle structure of a conventional scan design.
Figure 2:
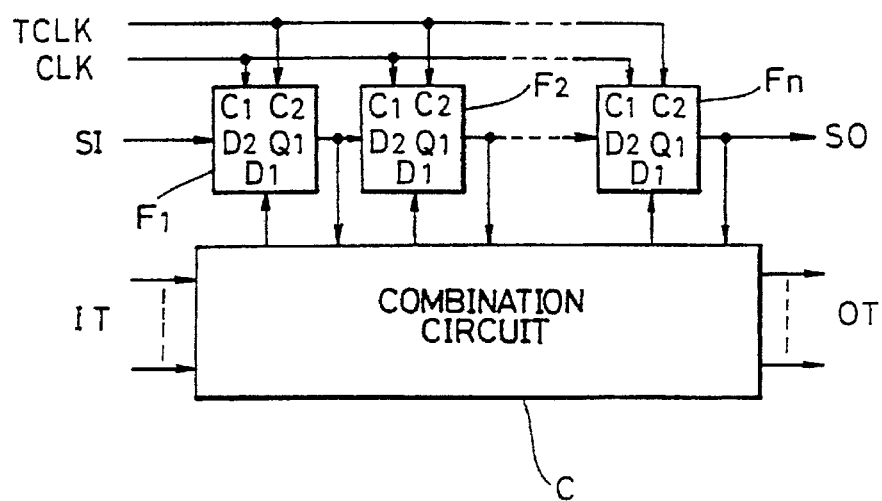
FIG. 2 shows specifically a structure of a conventional scan path method.
Figure 3:
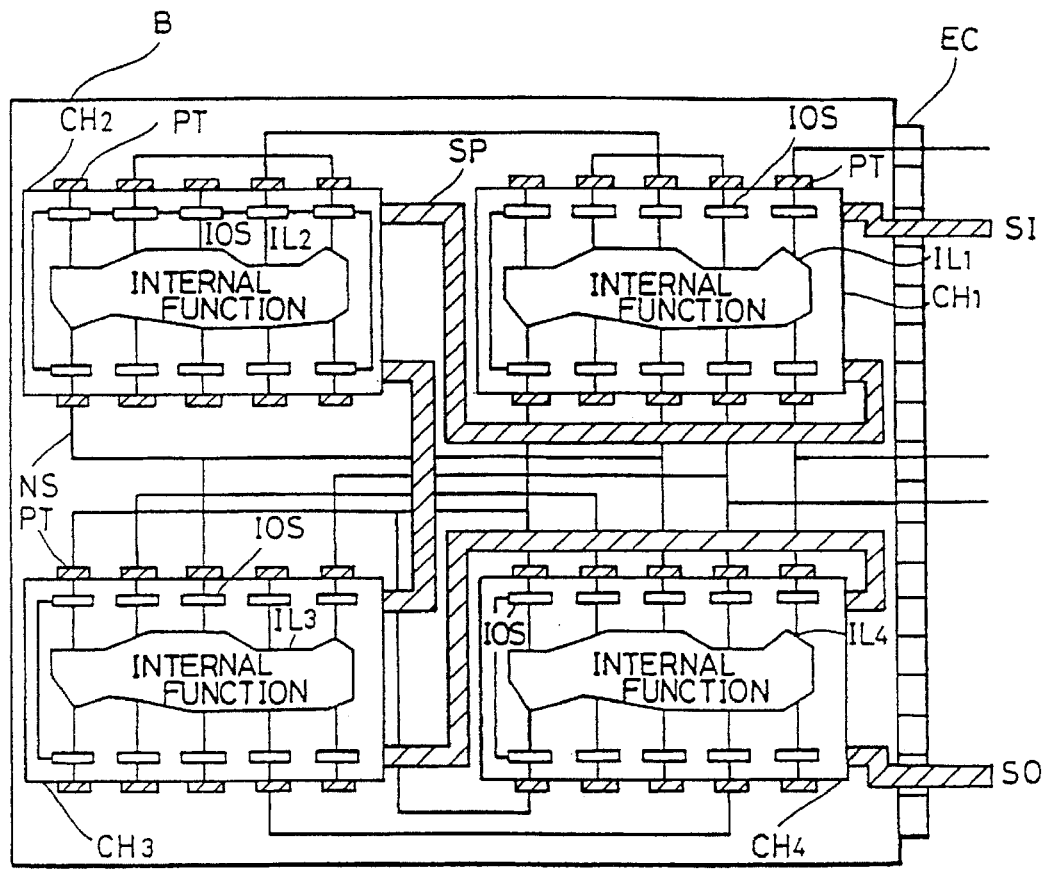
FIG. 3 shows an example of chip connection on a board according to boundary scan method.
Figure 4:
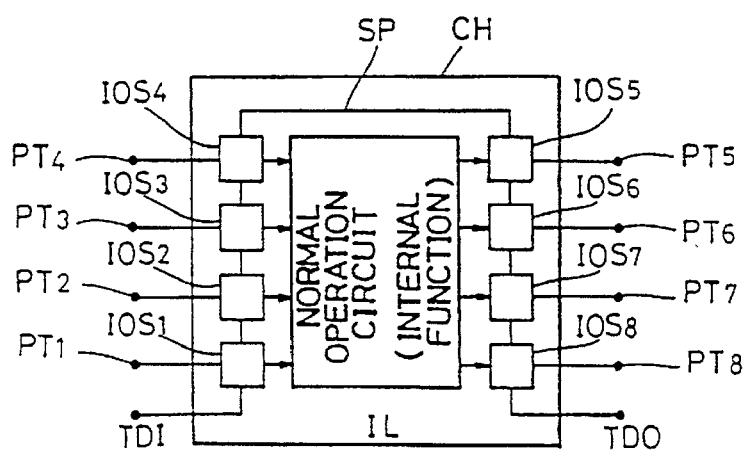
FIG. 4 shows an example of an internal test mode of a chip in boundary scan method.
Figure 5:
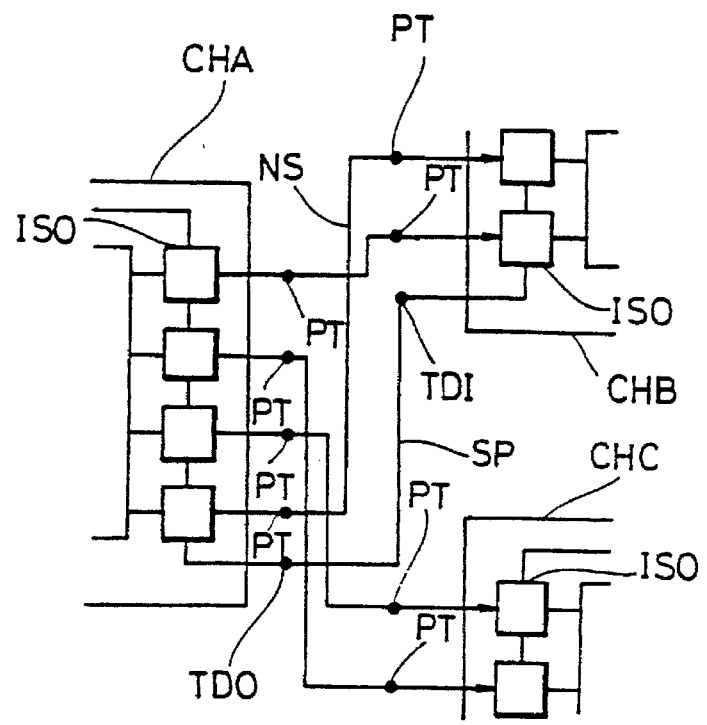
FIG. 5 is a diagram for explaining an external test mode in boundary scan design.
Figure 6:
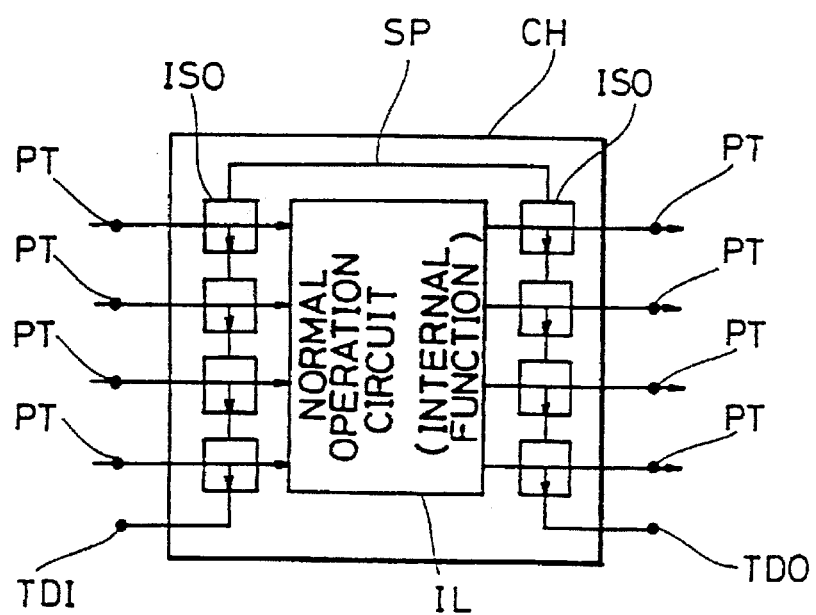
FIG. 6 is a diagram for explaining a sample mode in boundary scan method.
Figure 7:
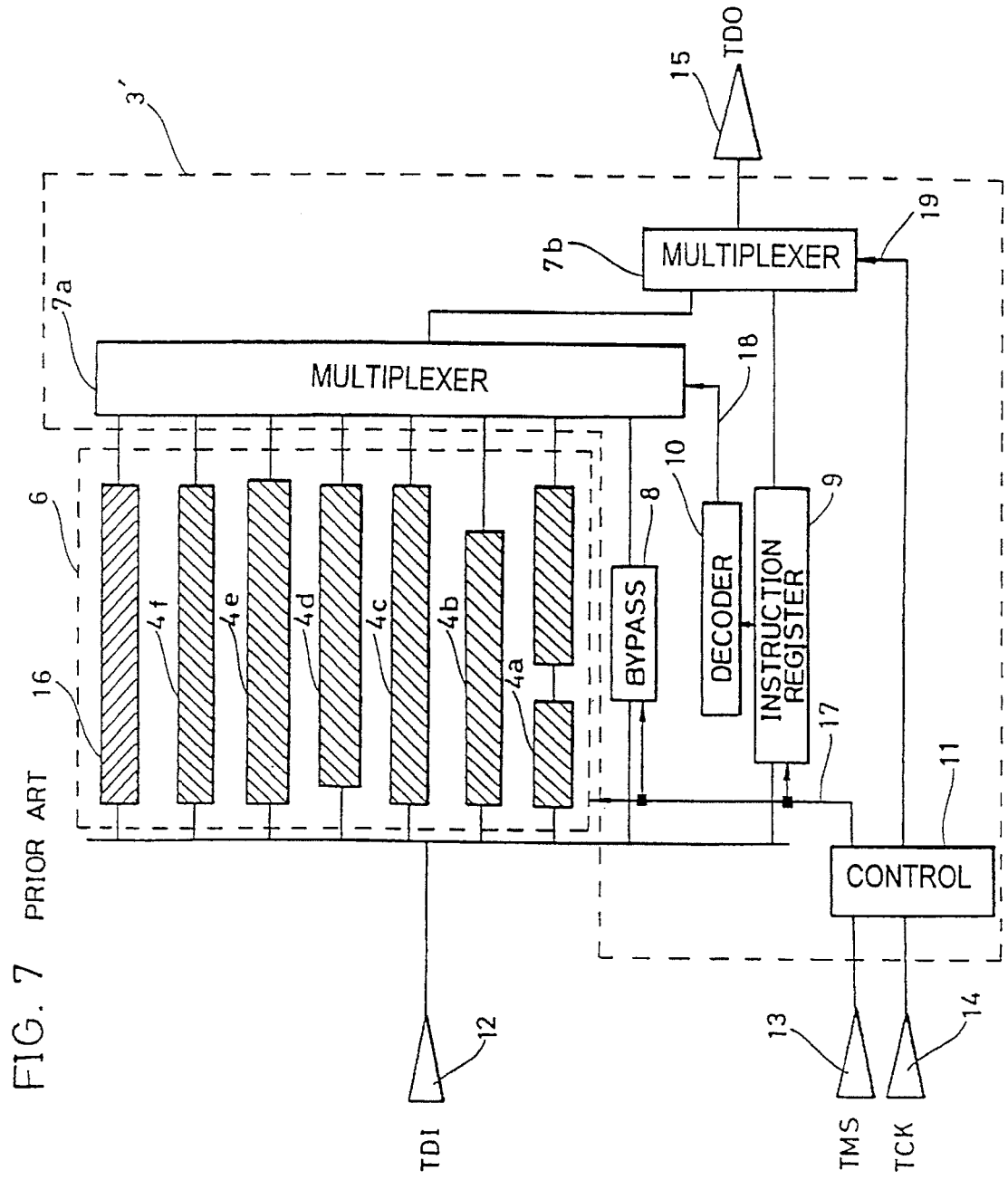
FIG. 7 is a block diagram showing the structure of a standardized testing circuit used in boundary scan method.
Figure 8:
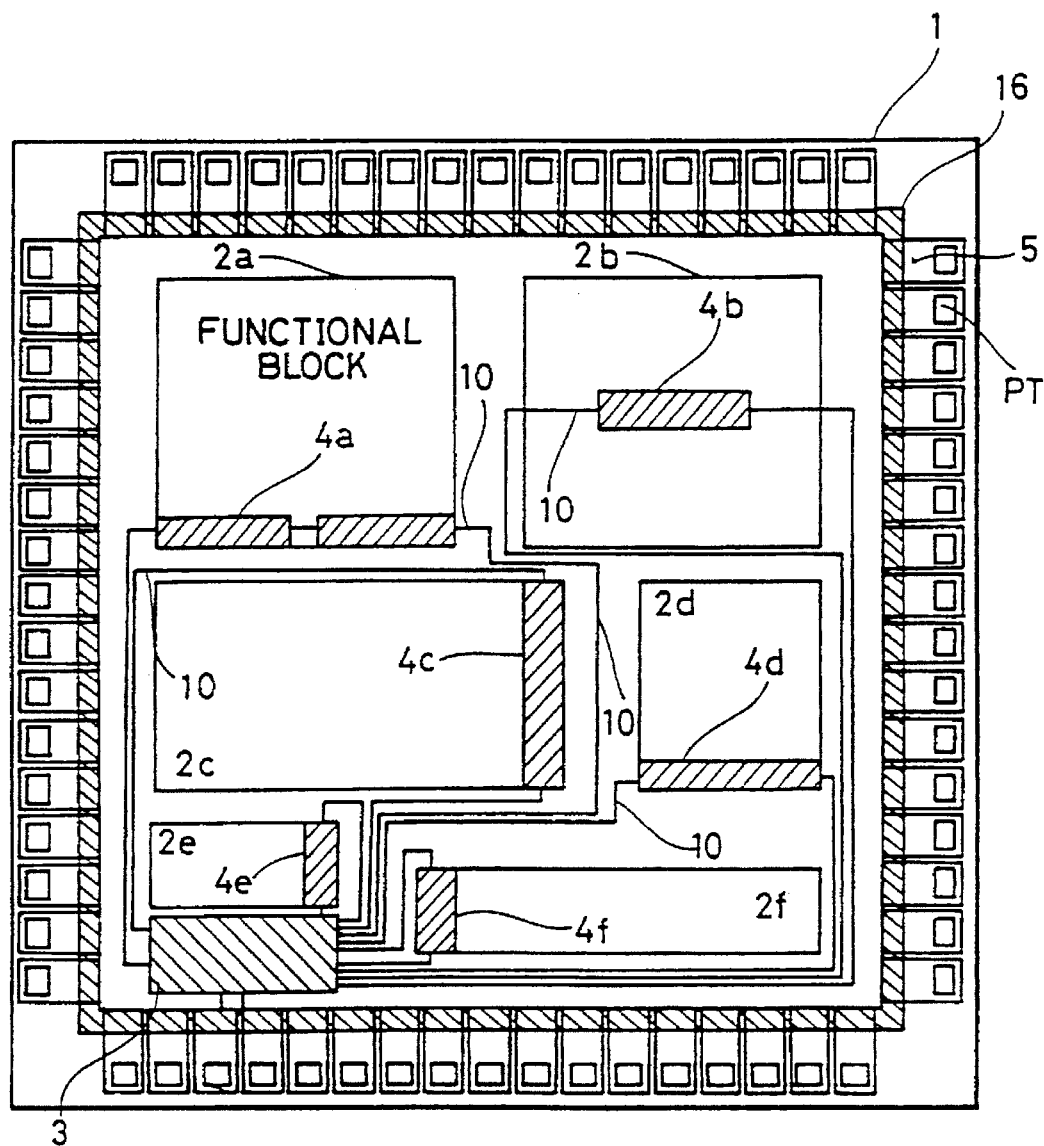
FIG. 8 shows the physical layout of a chip of a conventional semiconductor integrated circuit device.
Figure 9:
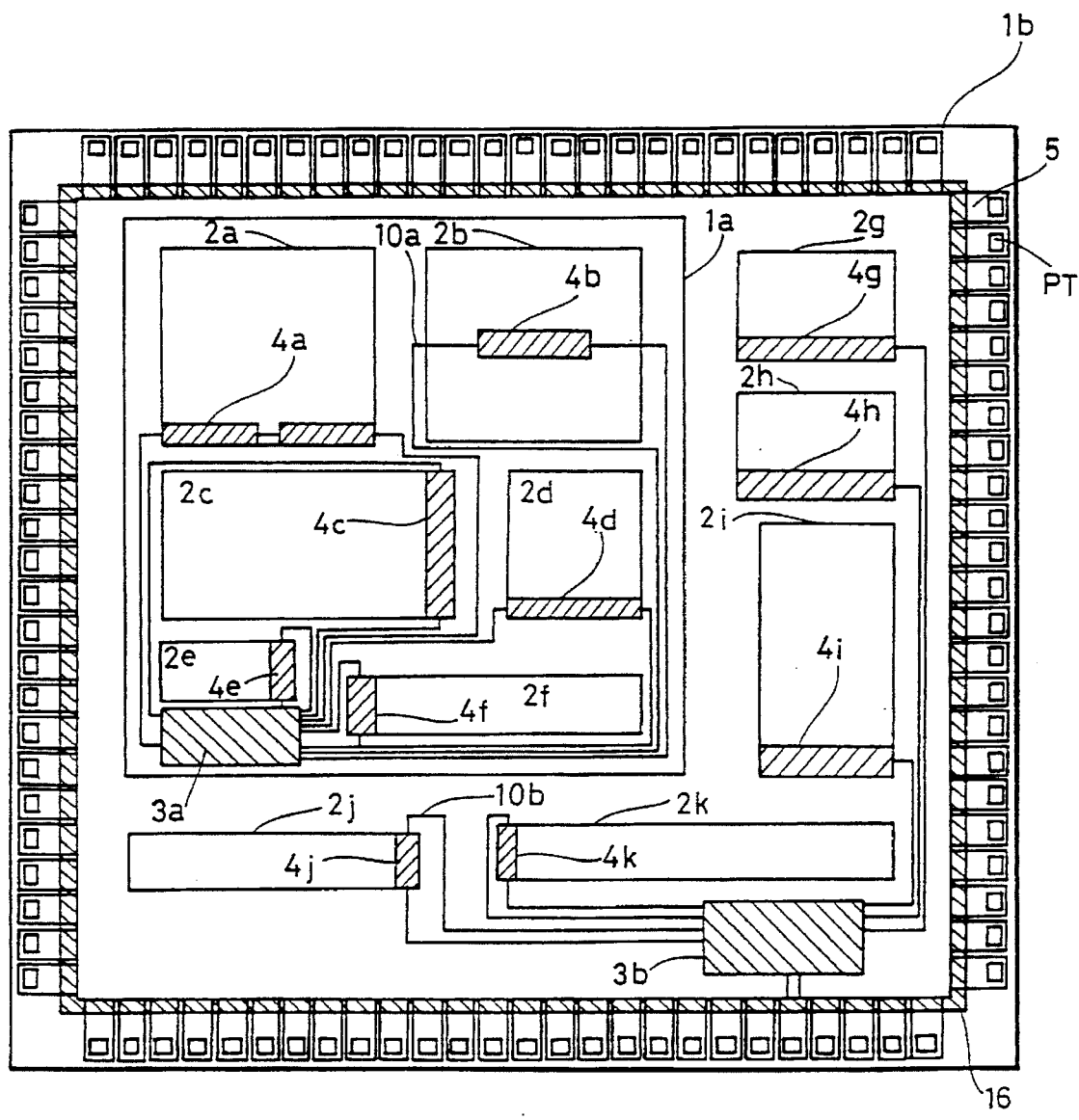
FIG. 9 shows the layout of a chip obtained in hierarchical design using the chip of FIG.
Figure 10:
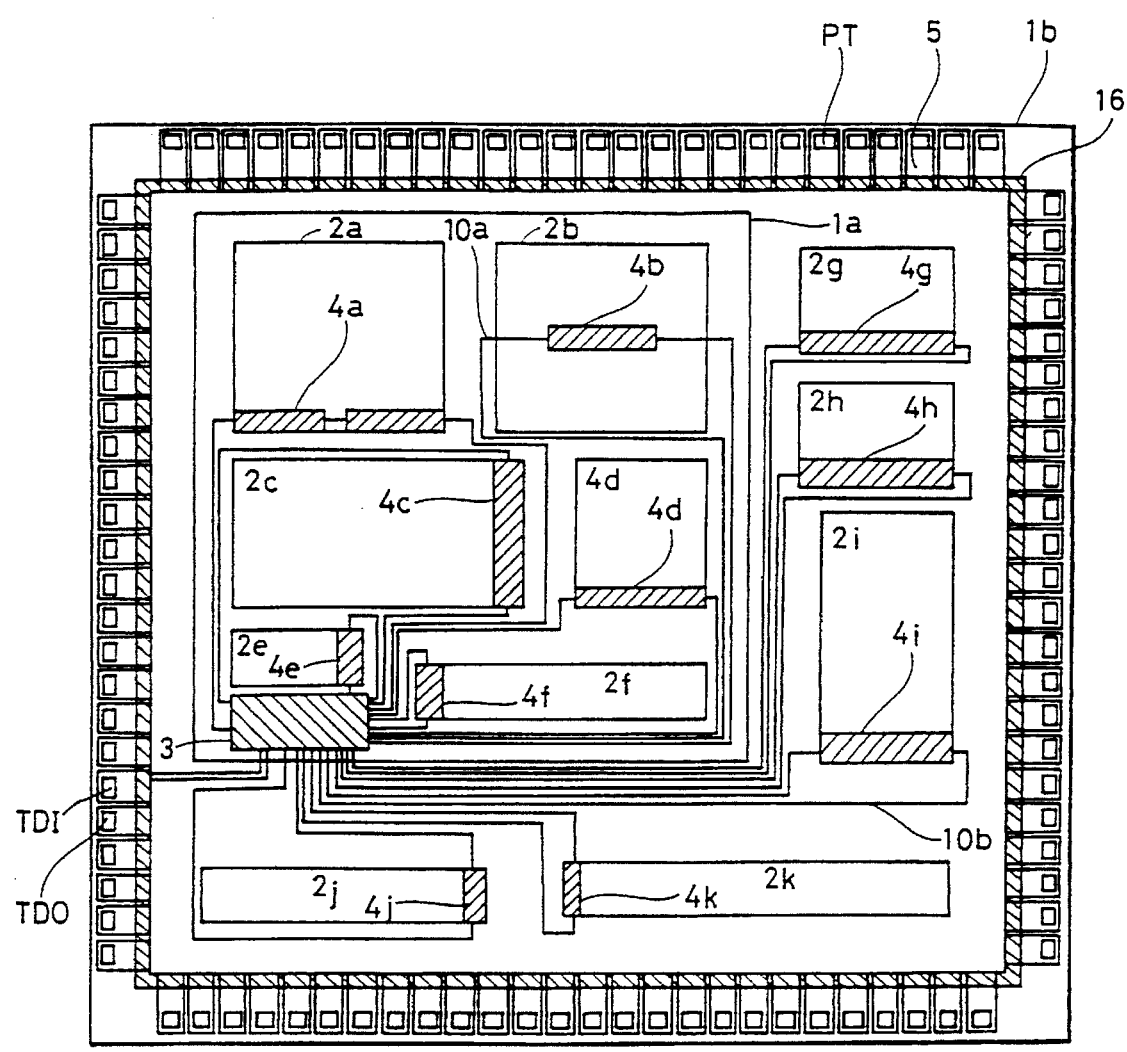
FIG. 10 shows another physical layout of a chip obtained in hierarchical design reusing the layout of the chip of FIG. 8.
Figure 11:
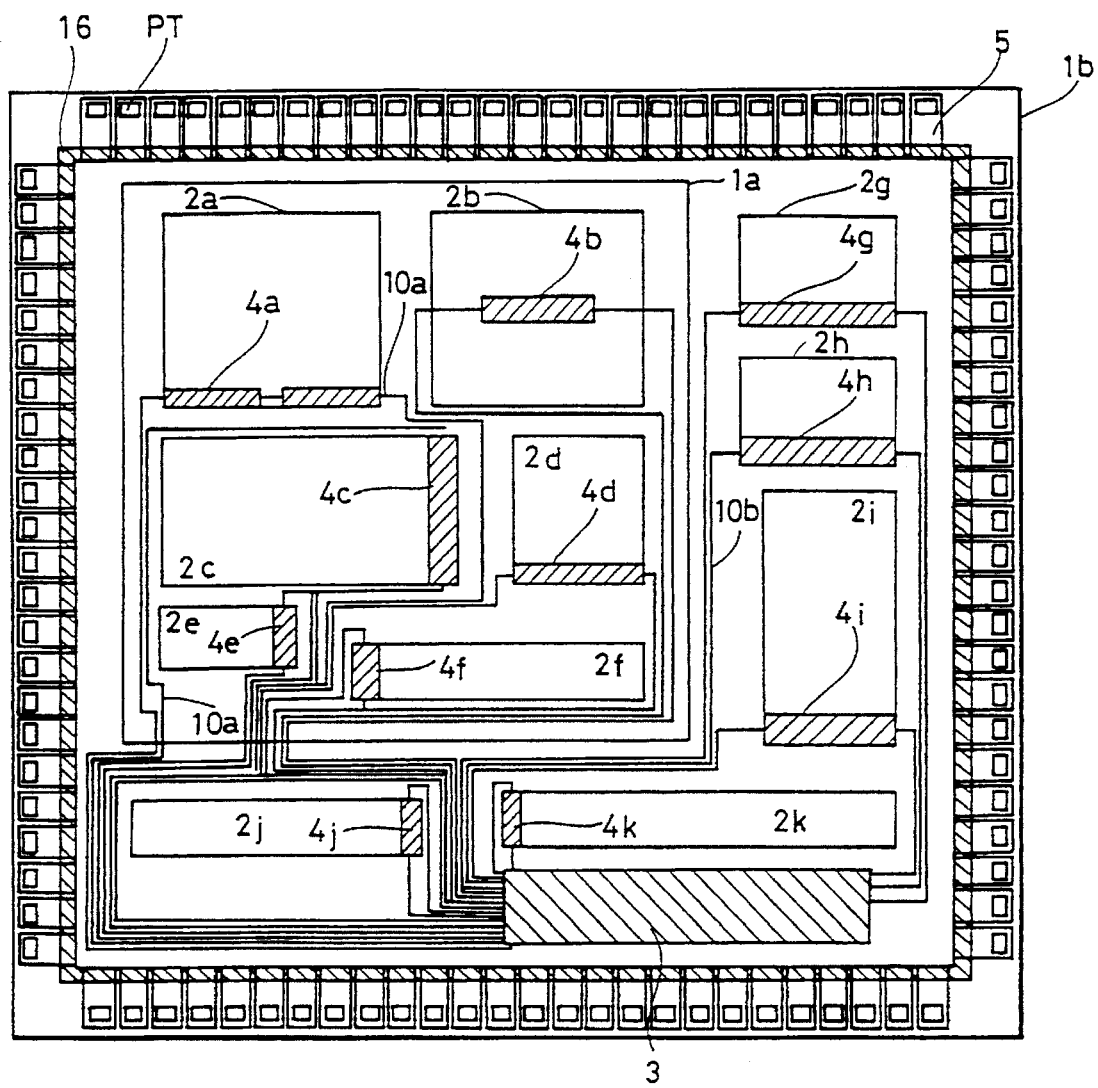
FIG. 11 shows a further physical layout of the chip obtained in hierarchical design reusing the chip of FIG. 8.
Figure 12:
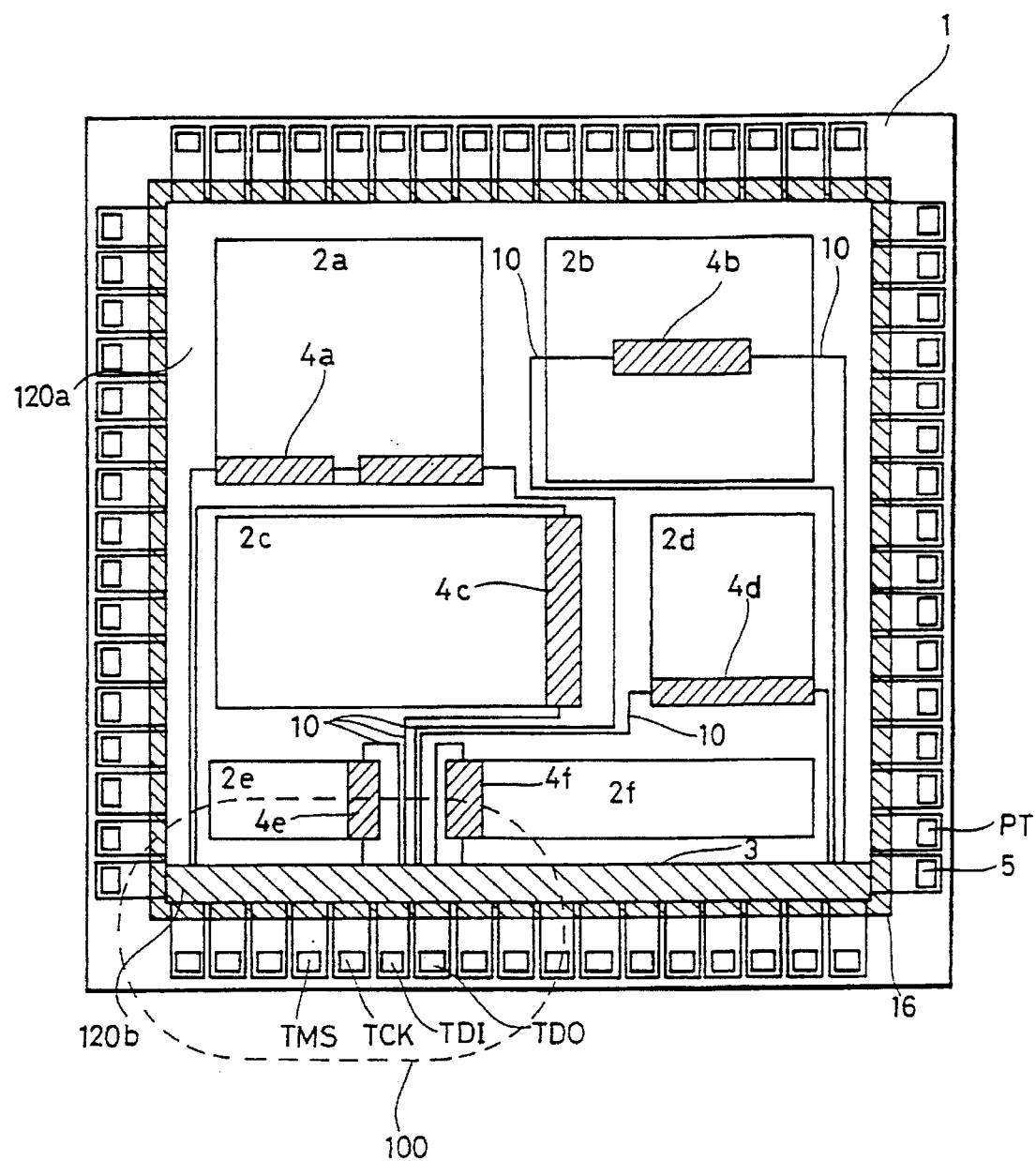
FIG. 12 schematically shows the layout of a chip of a semiconductor integrated circuit device according to an embodiment of the present invention.

FIG. 12 shows a layout of a chip of a semiconductor integrated circuit device according to an embodiment of the present invention. Referring to FIG. 12, a substantially rectangular semiconductor chip 1 comprises a first rectangular region 120a and a second rectangular region 120b. The first and second rectangular regions 120a and 120b form the internal region of semiconductor chip 1. Functional blocks 2a–2f are disposed in first rectangular region 120a for implementing functions specific to the semiconductor integrated circuit device formed on semiconductor chip 1. A test circuit block 3 is formed in second rectangular region 120b for implementing predetermined functions irrespective of the functional operation implemented by the semiconductor integrated circuit device. First and second rectangular regions 120a and 120b are regions independent of each other with identical width, sharing one side thereof. A "rectangular" means a quadrilateral comprising both a square and a rectangle.

A boundary scan register 16 and input/output cell 5 are formed at the periphery of the internal region (rectangular regions 120a and 120b).

Test data registers 4a–4f for transmitting test data are provided in each of functional blocks 2a–2f, respectively, within first rectangular region 120a. Test data registers 4a–4f are interconnected to test circuit block 3 formed in second rectangular region 120b by a connection 10 comprising a test data input/output line and a control signal line. Functional blocks 2a–2d have their layout established so that an optimum area usage efficiency is obtained in first rectangular region 120a.

Even if first and second rectangular regions 120a and 120b are used as the internal region in the above-described structure, test function circuit block 3 can be removed easily in removing second rectangular region 120b from the internal region of chip 1, because first rectangular region 120a is independent of second rectangular region 120b. The layout of functional blocks 2a–2f in first rectangular region 120a is not influenced in any manner when test circuit block 3 is removed.

Test circuit block 3 can be fixed as to be common to various LSIs (Large Scaled Integrated Circuit). Test circuit block 3 can be implemented as a hard macro circuit block (a circuit block having the layout fixed). It is also possible to fix in boundary scan the four test input and output terminals for testing, i.e. TMS (test mode selecting terminal), TCK (test clock input terminal), TDI (test data input terminal), and TDO (test data output terminal), as commonly required in various LSIs. It is also possible to fix and set the pin terminals.

The arrangement within second rectangular region 120b of the instruction register, the command decoder, the control circuit (TAP controller), the multiplexer and the like of test circuit block 3 is arbitrary. However, the provision of test circuit block 3 in a rectangular manner along one side of semiconductor chip 1 allows a wide distribution of signal connections connecting test data registers 4a–4f provided corresponding to each of functional blocks 2a–2f and test circuit block 3. This makes it possible to prevent local concentration of the connections to improve the layout efficiency.

Figure 13:
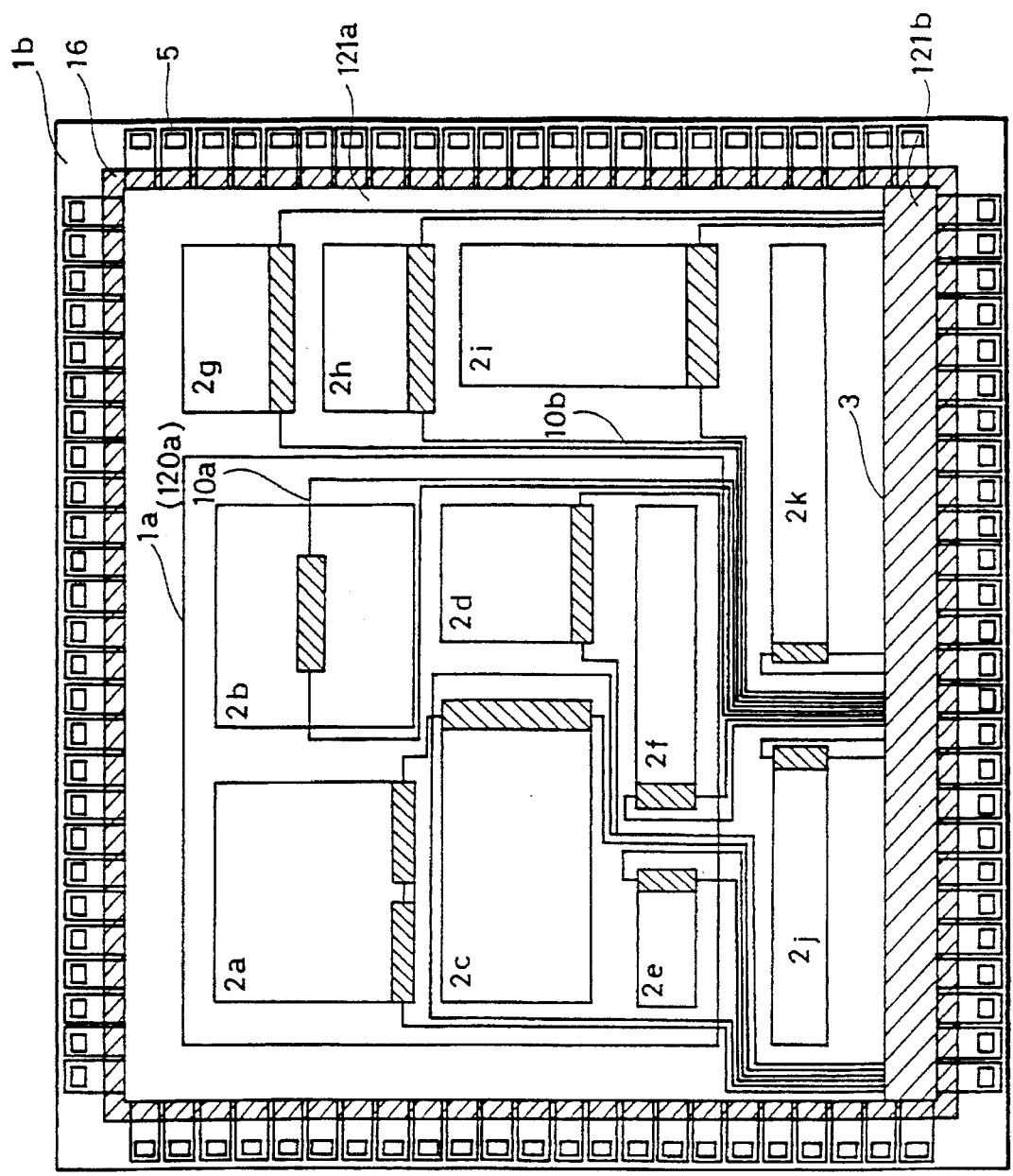
FIG. 13 shows the layout of a chip of a larger scale implemented by reusing the layout of the chip of FIG. 12.

FIG. 13 is a layout of a newly created chip employing hierarchical design by reusing the circuit of FIG. 12. Referring to FIG. 13, chip 1b comprises compound functional block 1a and newly added functional blocks 2g–2k. Compound functional block 1a uses only the first rectangular region 120a of FIG. 12. Test circuit block 3 provided in second rectangular region 120b in chip 1a is not used. The performance of compound functional block 1a is guaranteed because the physical layout of first rectangular region 120a is fixed. In the reuse thereof, it is possible to search out and utilize only the first rectangular region 120a if chip 1a as only the first rectangular region 120a registered as the internal region.

The new chip 1b comprises a newly designed test circuit block 3 in a second rectangular region 121b. The width of test circuit block 3 is equal to one side of chip 1b. Similarly to FIG. 12, test circuit block 3 is provided between input/output cell 5 and the internal region of chip 1b, i.e. first rectangular region 121a.

Because functional blocks 2a–2f carry out input and output of control signal and test data from and to an external source of first rectangular region 120a in compound functional block 1a under the layout of the chip of FIG. 13, modification of the connection region is not required. In the newly formed chip 1b, the connection region is set at an optimum layout with respect to test circuit block 3 formed in the new second rectangular region 121b.

Because the layout of chip 1b of FIG. 13 has first and second rectangular regions 121a and 121b formed independent of each other, as in FIG. 12, further hierarchical design may be made using chip 1b.

In the layout of the chips of FIGS. 12 and 13, test circuit block 3 is formed in the chip internal region inside I/O cell (I/O buffer) 5. However, it is possible to form test circuit block on the outside of I/O cell (I/O buffer) 5, as shown in FIG. 14, as far as the condition that a rectangular region is formed is satisfied.

Figure 14:
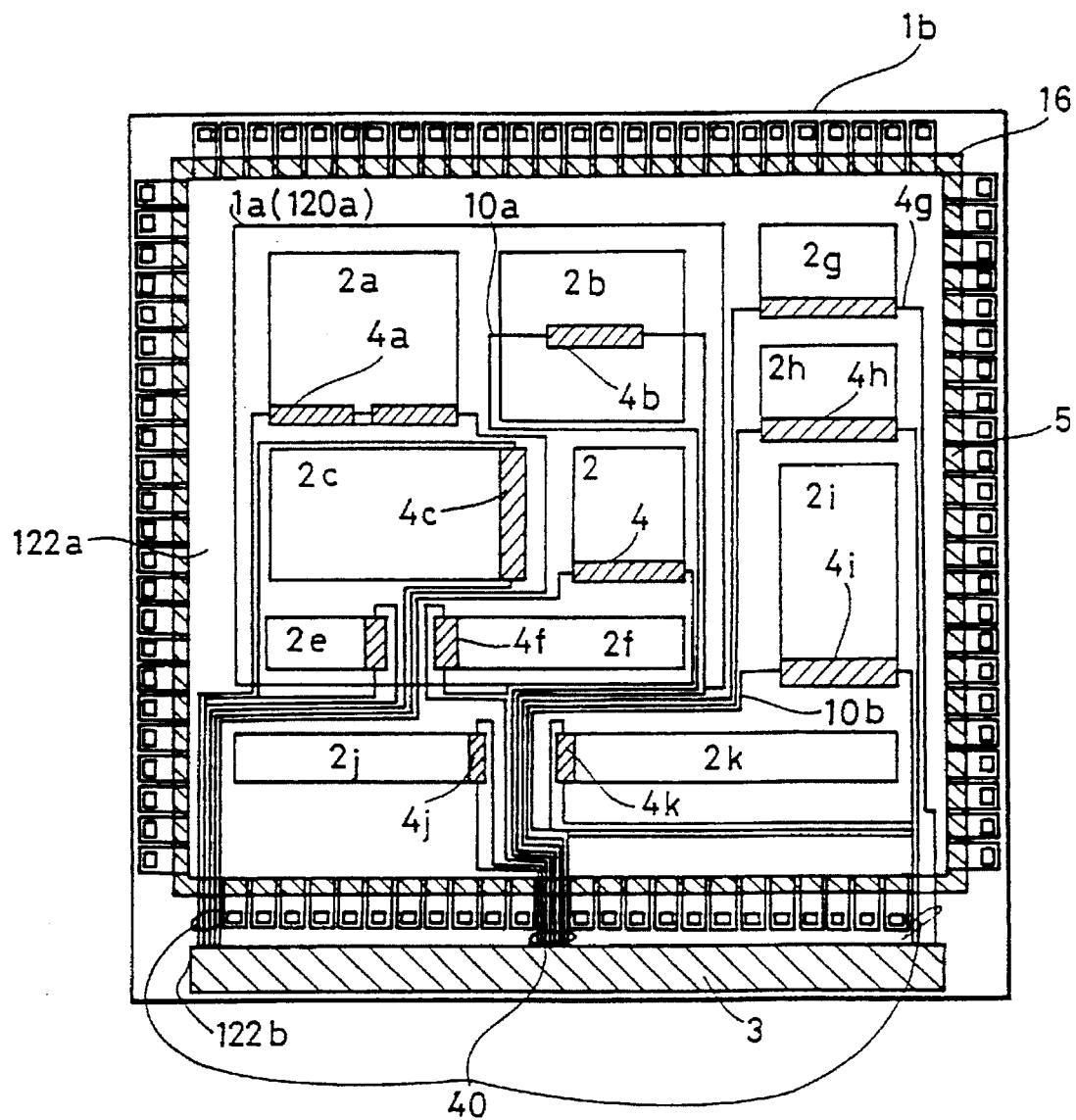
FIG. 14 schematically shows the layout on the chip of a semiconductor integrated circuit device according to another embodiment of the present invention.

FIG. 14 shows a layout of a chip of a semiconductor integrated circuit device according to another embodiment of the present invention. Referring to FIG. 14, test circuit block 3 is arranged along the periphery of I/O cells (I/O buffer) 5 arranged along one side of chip 1b. The second rectangular region 120b where test circuit block 3 is formed has a width equal to that of first rectangular region 120a forming the internal region of chip 1b. A connection region 40 is formed in a specified region of I/O cells (I/O buffers) 5 and boundary scan registers 16 for the purpose of disposing the test data I/O line and the control signal line between each of functional blocks 2a–2k in first rectangular region 122a and test circuit block 3. The signal connection arranged in connection region 40 and the signal line for connecting in series boundary scan registers 16 only cross each other. The signal connection in connection region 40 are arranged so that there is no adverse influence on the shift register structure of boundary scan registers 16. There is no problem in the chip layout of FIG. 14 in removing test circuit block for the reuse of chip 1b in hierarchical design, because the internal region of chip 1b is formed by the first rectangular region 122a. As in the cases of FIGS. 12 and 13, local concentration of connections can be avoided by virtue of connection region 40 being distributed along one side of chip 1b in the structure of FIG. 14.

Figure 15:
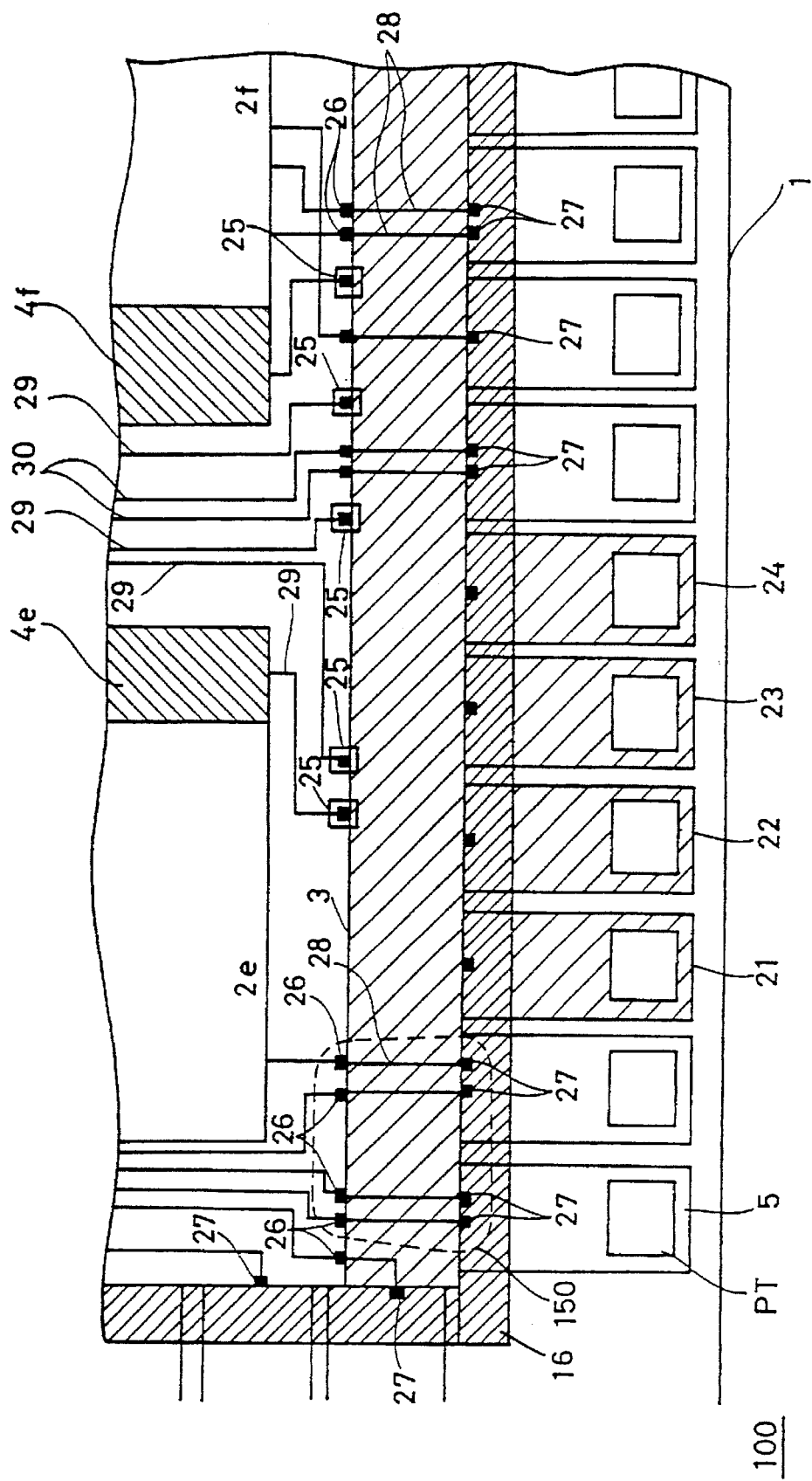
FIG. 15 is an enlarged detail view specifically showing a predetermined function control circuit (test circuit block) and the input/output cell portion.

FIG. 15 shows in detail the structure of the broken line block 100 indicated in FIG. 12. This structure is applicable to the layout of FIG. 14. Referring to FIG. 15, specific four I/O cells 21, 22, 23, 24 of the I/O cells (I/O buffer) 5 arranged along one side of chip 1 form a test access port. In other words, I/O cells 21–24 serve as the test data input port, the test data output port, the test mode selecting signal input port, and the test clock signal input port. Boundary scan register 16 is arranged to be included or adjacent to I/O cells (I/O buffers) 5. Boundary scan register 16 is connected to the I/O cell so that transmission of output data of the input cell or input data to output cell is possible. Signal input/output nodes 27 are provided for I/O cells 5, 21–24.

Signal input/output nodes 25 and 26 are provided opposite of the i/O cell of test circuit block 3. I/O node 26 is connected to I/O node 27 via signal line 28. This I/O node 26 receives a normal operation signal from I/O cell 5 via I/O node 27 and connection 28, to supply the same to the functional block formed in the chip internal region via signal connection 30.

I/O node 25 is connected to a register (for example, 4e and 4f) formed for testing via signal connection 29.

In circuit designing of test circuit block 3, connection 28 used for connecting I/O cell 5 to the functional blocks within the chip and I/O node 25 for testing are arranged in advance. I/O nodes 26 may be provided corresponding to each I/O cell 5 of chip 1. Alternatively, I/O nodes 26 may take a structure connecting I/O nodes 26 for normal operation with I/O cell 5, by providing a connection region 150 in a specific region of test circuit block 3 to arrange signal connections 28 only in connection region 150.

I/O nodes 25 for testing may be distributed appropriately in accordance with the arrangement of the functional blocks within chip 1. Alternatively, I/O nodes 25 may be provided only at a specific connection region using the specific connection region. The structure of providing a connection region in a specific region corresponds to that of test circuit block 3 of FIG. 14, for example.

In the circuit design of test circuit block 3, connection 28 and I/O node 25 are arranged, followed by setting of the layout of the circuits for obtaining optimum area usage efficiency.

Signal connection 28 is formed in the same steps as those of normal signal connection when a specific connection region of test circuit block is used therefor. When signal connection 28 crosses the connections of the circuits in the test circuit, through connection is used, for example of a different interconnection layer.

The above described testing circuit block can be fixed as having a common structure to various semiconductor integrated circuit devices. The testing circuit block can be implemented as a hard macro circuit block (a circuit block having the layout fixed).

Input/output terminals for testing 21–24 may be fixed as being commonly required in various semiconductor integrated circuit devices (the requirement of four signal lines in the test access port is standardized). As shown in FIG. 15, test circuit block 3 and input/output cells for testing 21–24 may be combined and be implemented as a hard macro circuit block.

The above-mentioned embodiment describes a testing circuit of boundary scan design employed as a predetermined function control circuit. However, this predetermined function control circuit is not limited to such a testing circuit, and an effect similar to that of the above-mentioned embodiment can be obtained as far as a circuit is employed that implements commonly used function irrespective of the internal function operation in a plurality of semiconductor integrated circuit devices.

Hence, according to the above described invention, an internal function circuit implementing specific function for each semiconductor integrated circuit device and a predetermined function control circuit implementing a predetermined function irrespective of the function implemented by the internal function circuit are formed on separate rectangular regions of identical width. This allows the removal of the predetermined function control circuit with ease in hierarchical design to facilitate hierarchical design. Because the internal function circuit frequently used in the hierarchical design can be used without modifying its layout, this circuit structure can be easily reserved in a library.

The predetermined function control circuit is formed in a second rectangular region having a width similar to that of a first rectangular region comprising the internal function circuit. It is therefore possible to disperse the signal I/O output lines of the predetermined function control circuit in a wide range to avoid local concentration of connection, resulting in improvement in layout efficiency on the chip.

Particularly, if the layout according to the present invention is employed in a chip in which the pad positions are standardized and the chip internal region is reserved in a repertory form (a member of the library, standardized), the predetermined function control circuit block can be easily arranged along one side of the chip by virtue of the chip internal region being standardized. Similarly, such a chip reserved in a repertory form can be easily reserved in a library.

Furthermore, because the predetermined function control circuit has the circuit portion thereof used in common to a plurality of semiconductor integrated circuit devices, hard macro form of the circuit block can be easily obtained to allow the scale of the predetermined function direct circuit to be increased to expand the chip internal region that can be used for the system.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A semiconductor integrated circuit device formed in a semiconductor chip, comprising;

an I/O buffer region formed along the entire periphery of said semiconductor chip to delineate a rectangular chip inner region, said I/O buffer region having input and output buffers formed therein for signal transmission with an external world;

inner circuitry region formed in said rectangular chip inner region including inner circuitry having a plurality of first components for implementing a signal processing function; and a single test circuit region formed on said chip inner region and having test circuitry for testing at least the inner circuitry formed in said chip inner region, said test circuitry including a plurality of second components and said test circuit region including no inner circuitry components for implementing the signal processing function, first interconnection lines for interconnecting first selected second components of said test circuitry with first selected first components of said inner circuitry, second interconnection lines for interconnecting second selected second components said test circuitry with the input and output buffers, third interconnection lines for interconnecting second selected first components of said inner circuitry with the input and output buffers, and no interconnection lines for interconnecting any first components of said inner circuitry with each other, wherein said inner circuitry region and said test circuit region each extend along substantially an entire length of one side of said rectangular chip inner region, said inner circuitry region forms a rectangular region sharing one side thereof with said test circuit region, and said test circuit region is placed between said I/O buffer region and said inner circuitry region.

2. A device according to claim 1, wherein the plurality of second components of said test circuitry comprise components for implementing a boundary scan test operation including a TAP controller for directing a test operation, two multiplexers, an instruction register for storing an applied instruction, a decoder for decoding the instruction in the instruction register, and bypass register for by-passing a test data to one of said two multiplexers.

3. A semiconductor integrated circuit device formed on a semiconductor chip, comprising:

an I/O buffer region formed on said semiconductor chip to delineate a rectangular chip inner region and having input and output buffers for communication of signals with an external world;

inner circuitry formed on said rectangular chip inner region and including first components to implement a signal processing function; and a test circuit region formed outside said I/O buffer region on said semiconductor chip and having test circuitry for testing at least said inner circuitry formed in said rectangular chip inner region;

said test circuit region including second components for implementing the test circuitry, first interconnection lines for interconnection between first selected second components of the test circuitry and first selected first components of said inner circuitry, second interconnection lines for interconnection between second selected second components of the test circuitry and the input and output buffers, and no interconnection lines for interconnecting any first components of said inner circuitry with each other;

the first interconnection lines for interconnection between the first selected second components of the test circuitry and the first selected first components of said inner circuitry running through the I/O buffer region, wherein said inner circuitry has said first components distributed over substantially the entire area of said rectangular chip inner region, said test circuit region extends substantially the entire length of one side of said semiconductor chip along said I/O buffer region, and said rectangular chip inner region is separated from said test circuit region by said I/O buffer region.

4. A device according to claim 2, wherein the second components of the test circuit include a TAP controller for directing a test operation, two multiplexers, an instruction register for storing an applied instruction, a decoder for decoding the instruction in the instruction register, and bypass register for by-passing a test data to one of said two multiplexers, the TAP controller, two multiplexers, instruction register, decoder, and bypass register implementing a boundary scan test operation.

* * * * *